(12) United States Patent
Mohrdiek et al.

(10) Patent No.: US 8,526,103 B2
(45) Date of Patent: Sep. 3, 2013

(54) LASER SYSTEM WITH HIGHLY LINEAR OUTPUT

(75) Inventors: Stefan Mohrdiek, Bäch (CH); Evgeny Zibik, Zürich (CH); Hans Ulrich Pfeiffer, Zürich (CH); Boris Sverdlov, Langnau am Albis (CH)

(73) Assignee: Oclaro Technology Limited, Northamptonshire (GB)

( * ) Notice: Subject to any disclaimer, the term of this patent is extended or adjusted under 35 U.S.C. 154(b) by 315 days.

(21) Appl. No.: 12/993,617

(22) PCT Filed: Aug. 19, 2010

(86) PCT No.: PCT/IB2010/002047
§ 371 (c)(1),
(2), (4) Date: Nov. 19, 2010

(87) PCT Pub. No.: WO2011/083359
PCT Pub. Date: Jul. 14, 2011

(65) Prior Publication Data
US 2011/0292496 A1   Dec. 1, 2011

Related U.S. Application Data

(60) Provisional application No. 61/293,236, filed on Jan. 8, 2010.

(51) Int. Cl.
*H01S 3/00* (2006.01)
(52) U.S. Cl.
USPC .......................................... 359/344; 372/100

(58) Field of Classification Search
USPC .................................... 359/344; 372/92, 102
See application file for complete search history.

(56) References Cited

U.S. PATENT DOCUMENTS

| | | | |
|---|---|---|---|
| 4,793,679 A | 12/1988 | Toda et al. | |
| 4,821,277 A * | 4/1989 | Alphonse et al. | 372/45.01 |
| 5,563,732 A | 10/1996 | Erdogan et al. | |
| 5,715,263 A | 2/1998 | Ventrudo et al. | |
| 5,870,417 A | 2/1999 | Verdiell et al. | |

(Continued)

FOREIGN PATENT DOCUMENTS

| EP | 0 991 153 A1 | 4/2000 |
|---|---|---|
| EP | 1 087 479 A1 | 3/2001 |

(Continued)

OTHER PUBLICATIONS

R.J. Campbell et al, "Wavelength stable uncooled fibre grating semiconductor laser for use in an all Optical WDM access network", Electronics Letters, IEE Stevenage, GB, vol. 32, No. 2, Jan. 18, 1996, pp. 119-120.

(Continued)

*Primary Examiner* — Mark Hellner
(74) *Attorney, Agent, or Firm* — Fenwick & West LLP

(57) ABSTRACT

A laser device having a semiconductor gain element optically coupled to an optical fiber by using an angled anamorphic fiber lens and including a wavelength-selective front reflector. The laser device possesses improved output characteristics such as a highly linear laser emission output, even when the amplification section produces a high amount of gain. Such a laser source can also be used in various applications such as pump lasers for fiber amplifiers or frequency doubling systems.

19 Claims, 6 Drawing Sheets

(56) References Cited

U.S. PATENT DOCUMENTS

| | | | |
|---|---|---|---|
| 5,940,557 A | | 8/1999 | Harker |
| 5,978,400 A | * | 11/1999 | Campbell et al. ............ 372/46.01 |
| 5,995,692 A | * | 11/1999 | Hamakawa et al. ............. 385/49 |
| 6,215,809 B1 | | 4/2001 | Ziari et al. |
| 6,525,872 B1 | | 2/2003 | Ziari et al. |
| 6,819,702 B2 | * | 11/2004 | Sverdlov et al. ............... 372/102 |
| 6,888,863 B1 | * | 5/2005 | Chen et al. .................. 372/43.01 |
| 7,099,361 B2 | | 8/2006 | Matuschek et al. |
| 2002/0106156 A1 | | 8/2002 | Vail et al. |
| 2002/0136254 A1 | | 9/2002 | Yoshida et al. |
| 2003/0099440 A1 | | 5/2003 | Kim |
| 2003/0181639 A1 | | 9/2003 | Eaton et al. |
| 2005/0111512 A1 | * | 5/2005 | Krieg ............................... 372/92 |
| 2008/0123703 A1 | | 5/2008 | Mohrdiek et al. |

FOREIGN PATENT DOCUMENTS

| | | |
|---|---|---|
| EP | 1 130 717 A2 | 9/2001 |
| EP | 1931000 A1 | 6/2008 |
| GB | 2 398 425 A | 8/2004 |
| WO | WO 96/18132 | 6/1996 |
| WO | WO 01/22544 A1 | 3/2001 |
| WO | WO 2004/073124 A1 | 8/2004 |

OTHER PUBLICATIONS

International Search Report for corresponding International Application No. PCT/IB2010/002047 mailed Dec. 7, 2010.
Form PCT/ISA/237 and concise explanation for corresponding International Application No. PCT/IB2010/002047 mailed Dec. 7, 2010.
IEEE Journal of Quantum Electronics, Apr. 2004, vol. 40, Issue 4, pp. 354-363.
IEEE Electronics Letters, Jan. 18, 1996, vol. 32 Issue: 2, pp. 119-120.
E.A. Zibik et al., Novel single-mode fiber coupled broadband seed source for pulsed fiber laser systems, Novel In-Plane Semiconductor Lasers IX, vol. 7616, pp. 76161K-76161K-9 (2010).
Bing Guo et al., 980 nm Pump Laser Module with 750 mW Output Power, pp. 1-8.
Dietrich Marcuse. Reflection Loss of Laser Mode From Tilted End Mirror, Journal of Lightwave Technology, vol. 7, No. 2, Feb. 1989, pp. 336-339.
S. Mohrdiek et al, Performance and reliability of pulsed 1060 nm laser modules, Photonics West 2008, Fiber Lasers V: Technology, Systems, and Applications, Paper 6873-72, pp. 1-7.
D.R. Scifres et al., GaAs/GaAlAs Diode Lasers with Angled Pumping Stripes, IEEE Journal of Quantum Electronics, vol. QE-14, No. 4, Apr. 1978, pp. 223-227.
Archambault, Jean-Luc, et al., "Fiber Gratings in Lasers and Amplifiers," Journal of Lightwave Technology, vol. 15, No. 8, pp. 1378-1390, Aug. 1997.
Hashizume, Naoki, et al., "Mode Hopping Control and Lasing Wavelength Stabilization of Fiber Grating Lasers," Furukawa Review, No. 20, 10 Pages, 2001.
Kashyap, Raman, "Fiber Bragg Gratings," Academic Press, 1999, Kelly et al. (Eds.), pp. 195-196, 208-211, 229-246 and 355-398.
Kozlovsky, W.J., et al., "Blue light generation by resonator-enhanced frequency doubling of an extended-cavity diode laser," Applied Physics Letters, vol. 65, No. 5 pp. 525-527, Aug. 1994.
Patent Cooperation Treaty, Written Opinion of the International Search Authority, International Patent Application No. PCT/IB2005/001096, Mailed Aug. 29, 2005, 9 Pages.
Patent Cooperation Treaty, International Search Report, International Patent Application No. PCT/IB2005/001096, Mailed Aug. 29, 2005, 5 Pages.

\* cited by examiner

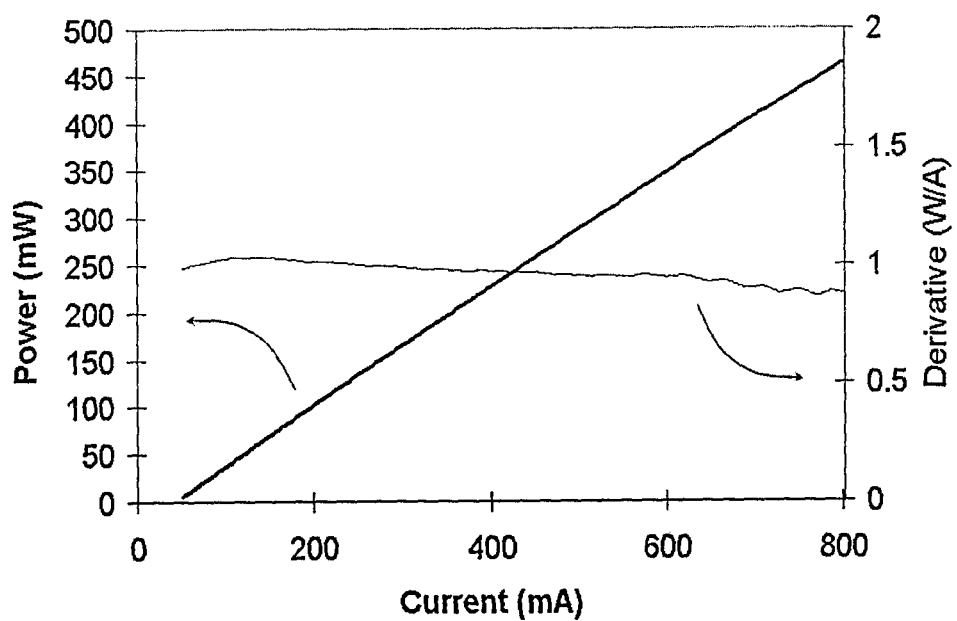

LASER SYSTEM WITH HIGHLY LINEAR OUTPUT

RELATED APPLICATION DATA

This application claims the benefit of U.S. Provisional Patent Application No. 61/293,236 filed Jan. 8, 2010 which is incorporated herein by reference in its entirety.

TECHNICAL FIELD

The present invention relates generally to the stabilization of a laser, specifically a semiconductor laser device of the type commonly used in opto-electronics.

BACKGROUND

Semiconductor laser diodes have become important components in the technology of optical communication, particularly because such laser diodes can be used for amplifying optical signals immediately by optical means. This allows for the design of all-optical fiber communication systems, avoiding complicated conversions of the signals to be transmitted. The latter improves speed as well as reliability within such communication systems.

In one kind of optical fiber communication system, the lasers are used for pumping erbium-doped fiber amplifiers, so called EDFAs, which have been described in various patents and publications known to the person skilled in the art. An example of some technical significance are 980 nm lasers with a power output of 100 mW or more, which wavelength matches the 980 nm erbium absorption line and thus achieves a low-noise amplification.

A conventional design of a laser device 1 is illustrated in FIG. 1. Here a semiconductor laser 11 includes a waveguide 20, rear facet 16, and front facet 18. The semiconductor laser 11 is combined with an optical fiber 14 to effectively guide the light through a partially reflecting, wavelength selective reflector 26 to an optical amplifier (not illustrated). The optical fiber 14 includes a fiber lens 22 and a lens tip 24 thereof. Light from waveguide 20 is incident upon the fiber lens 22 at the lens tip 24. The optical fiber 14 produces a few percent of feedback and locks the laser device 1 to the prescribed wavelength of the wavelength selective reflector 26. Descriptions of such a design can be found, for example, in U.S. Pat. No. 7,099,361 and in US Patent Application Publication No. 2008/0123703. This design provides for a laser without the need for an active temperature stabilizing element, as the stabilization by a wavelength selective reflector 26 constituted as a fiber Bragg grating (FBG) yields low temperature sensitivity of the wavelength shift, typically by about 7 pm/° K, which cannot be achieved by a grating inside the semiconductor laser 11 (DBR or DFB structure).

The effects of constructive and destructive interference between residual reflections of laser front facet 18 and fiber lens 22 were previously investigated for the laser device 1 illustrated in FIG. 1 but without a wavelength selective reflector 26 in "Impact of near-end residual reflectivity on the spectral performance of high-power pump lasers", IEEE Journal of Quantum Electronics, April 2004, Volume: 40, Issue 4, pp. 354-363. The study revealed that even for standard lenses and laser facets both having AR coatings much lower than 1%, the effective laser front reflectivity from combined reflection varies with different operating conditions, i.e. changes with temperature and laser current. As a result, discontinuities in the laser spectrum can be observed. For state-of-the-art lasers at the time of the study which had a shorter cavity length, i.e. less roundtrip gain and less coherence, these effects were negligible when wavelength stabilization by a FBG was applied.

But it has been found by the inventors that conventional laser devices 1 such as that illustrated in FIG. 1 having a semiconductor laser 11 with a longer cavity (e.g., greater than 3 mm) and that produce a high amount of gain are more susceptible to the effects from residual reflections and/or feedback of any reflectors in the optical path, as well as effects of additional Fabry-Perot (FP) cavities formed between multiple reflectors. As illustrated in FIG. 6A, such effects can produce a high amount of unwanted ripple in the optical power versus current characteristic. Even a small amount of back reflection from an AR coated lens tip 24 or AR coated front facet 18 into the semiconductor laser 11, which produces a high amount of gain, can have large impact. The laser output can also become very sensitive to subtle changes to optical coupling.

It is known that curved waveguides with tilt angles, e.g. more than 2° with respect to a face of the front facet, can suppress back reflections into the waveguide. Such an arrangement reduces optical feedback (i.e., back reflections) from the front facet 18 as the radiation reflected from the front facet 18 does not couple into the active waveguide 20 itself. Accordingly, other conventional designs incorporate a curved waveguide 20 which forms effectively a semiconductor gain element 12, rather than a semiconductor laser 11, in the absence of a front facet feedback. In the conventional laser device 5 illustrated in FIG. 2, a laser cavity is only established by providing an additional feedback element into the optical path, which is the wavelength selective reflector 26 in this case. Here the semiconductor gain element 12 is combined with an optical fiber 14 having a conventional fiber lens 22. The conventional fiber lens 22 includes a lens tip 24 that is orthogonal to the longitudinal axis of the optical fiber 14. The fiber lens is arranged such that optical radiation emitted from the semiconductor gain element 22 (i.e., the propagation direction of optical radiation from the semiconductor gain element 22) is orthogonal to the lens tip 24.

The laser device 5 of FIG. 2 provides some improvement over the laser device 1 of FIG. 1 (see FIG. 6B), and has previously been applied with some success for semiconductor gain elements with low gain (e.g., Wavelength stable uncooled fiber grating semiconductor laser for use in an all optical WDM access network", IEEE Electronics Letters, 18 Jan. 1996, Volume: 32 Issue: 2, pp. 119-120). However, the ripples in the power versus current characteristics cannot be fully suppressed. That is, while the FP cavity formed between the rear facet 16 and front facet 18 in FIG. 2 is spoiled by using the curved waveguide 20, and while the additional cavity that appears between fiber lens 22 and front facet 18 is significantly suppressed by tilting both the emitted optical radiation and the fiber lens, the FP cavity formed between the rear facet 16 and the fiber lens 22 remains, contributing to unwanted ripples in the power versus current characteristic even if an AR coating is applied on the fiber lens tip 24.

SUMMARY OF INVENTION

The present invention provides a laser device having improved output characteristics by removing significant sources of feedback within the laser cavity. A highly linear laser emission output is obtained and therefore enables lasing operations at high output power from the optical fiber. The laser device provides substantial suppression of gain ripple effects while achieving wavelength stabilization with the wavelength selective reflector. Additionally, the configuration of the fiber lens allows for the positioning of the fiber lens in close proximity to the semiconductor gain element while overcoming potential danger of the fiber touching the semiconductor facet.

In accordance with one aspect of the invention, a laser device includes: a semiconductor waveguide containing a gain element and limited by rear and front facets of the semiconductor waveguide, an optical fiber waveguide with a fiber lens coupling radiation between the optical fiber and the front facet of the semiconductor waveguide, a wavelength-selective reflector arranged within the optical fiber to form a laser cavity between the rear facet and the wavelength-selective reflector and having both a face of the front facet of the semiconductor waveguide and a face of the fiber lens arranged non-orthogonal to a propagation direction of a laser mode.

According to one embodiment, the semiconductor waveguide contains a curved section and is configured to direct optical radiation at an angle to the normal of the front facet and parallel to the normal of the rear facet.

According to another embodiment, the fiber lens is configured as a mode matching element that enables bi-directional transfer of optical radiation.

According to another embodiment, the fiber lens is configured such that the angle ($\omega$) between the face of the front facet and the face of the lens tip is determined by relation $$\omega = \arcsin[\sin(\alpha) \times n1/n2] - \phi,$$

where n1 and n2 are indexes of refraction of the optical fiber and surrounding medium, respectively, $\phi$ is an angle of refraction of optical radiation at the face of front facet, and $\alpha$ is an angle of refraction of optical radiation at the face of the lens tip.

According to another embodiment, $\phi$ ranges from about 4.5° to about 60°. According to another embodiment, $\alpha$ ranges from about 2° to about 35°. According to another embodiment, $\omega$ ranges from about −30° to about 30°. According to another embodiment, the lens is configured such that a portion of the optical radiation reflected from the lens tip is reflected at an angle $\gamma = \phi + 2\omega$, wherein $\gamma$ is greater than about 2°.

According to another embodiment, the face of the lens tip is parallel to the face of the front facet in a plane of light incidence. According to another embodiment, the angle of refraction of the optical radiation at the front facet of said gain element ranges from about 4.5° to about 20°. According to another embodiment, the angle of refraction of the optical radiation passing through the face of the lens ranges from about 3° to about 13.3°.

According to another embodiment, the front facet includes an anti-reflection coating.

According to another embodiment, the fiber lens includes an anti-reflection coating.

According to another embodiment, the wavelength selective reflector locks the laser device to a wavelength.

According to another embodiment, a bandwidth of the wavelength selective reflector is from about 10 pm to about 5 nm.

According to another embodiment, the reflectance of the wavelength selective reflector is from about 0.5% to about 20%.

According to another embodiment, the non-orthogonal portion of the waveguide is arranged at an angle of about 1.5° to about 15° relative to the normal of the face of the front facet.

According to another embodiment, the optical fiber is coupled to at least one of an erbium-doped fiber amplifier and a Raman amplifier.

The foregoing and other features of the invention are hereinafter described in greater detail with reference to the accompanying drawings.

BRIEF DESCRIPTION OF THE DRAWINGS

FIG. 6A-C are graphs illustrating the effect of optimum power versus current characteristics on the exemplary laser device in accordance with the present invention (6C) as compared with such non-optimum effects on the conventional laser devices of FIGS. 1 and 2 (6A and 6B, respectively).

DESCRIPTION

Figure 1:
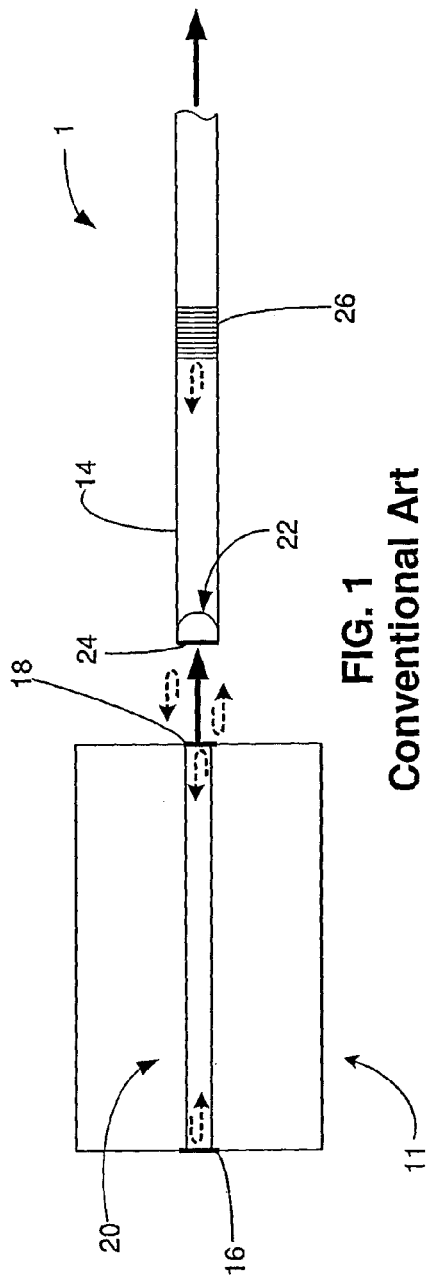
FIG. 1 is a top view schematic diagram of a conventional laser device.

In the description that follows, like components have been given the same reference numerals, regardless of whether they are shown in different embodiments. To illustrate an embodiment(s) of the present invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

Figure 3:
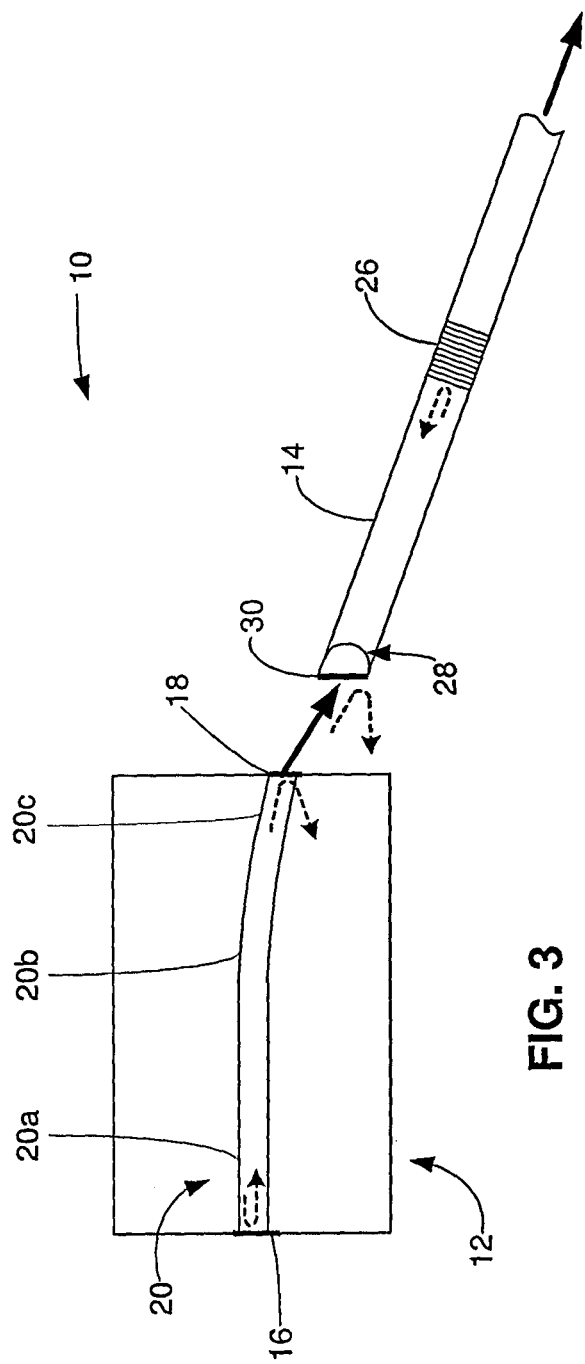
FIG. 3 is a top view schematic diagram of an exemplary laser device in accordance with the present invention.

Referring now in detail to the drawings and initially to FIG. 3, a schematic diagram of an exemplary laser device is shown generally at 10. The laser device 10 includes a semiconductor gain element 12 that is optically coupled to an optical fiber 14 including an anamorphic fiber lens 28. The fiber lens 28 includes an angled lens tip 30 that functions as a mode matching element (or mode converter) between the semiconductor gain element 12 and the optical fiber 14. As such, optical radiation emitted from the semiconductor gain element 12 is passed through the fiber lens 28 to the optical fiber 14 as a desired amount of feedback is reflected back from the optical fiber 14 due to the wavelength selective reflector 26 to the semiconductor gain element 12. This feedback must reach the semiconductor gain element 12 as the light path in this backward direction is essential for the laser device's performance (i.e., this feedback locks the laser device 10 to the prescribed wavelength of the wavelength selective reflector 26). In addition to its functionality as a two-directional light path, the fiber lens 28 in accordance with the present invention also removes a significant source of feedback within the laser cavity (which is defined by the optical path between the rear facet 16 of the semiconductor gain element 12 and the wavelength selective reflector 26 formed along the optical fiber 14). The features of the fiber lens 28 are described in more detail below.

The semiconductor gain element 12 may be constructed from indium gallium arsenide (InGaAs). InGaAs is used herein as an exemplary material because it is a semiconductor material that allows for optical devices such as lasers to be readily constructed and integrated thereon. For example, strained quantum-well InGaAs lasers are commonly used for erbium amplifiers at an erbium absorption wavelength of about 980 nm. Accordingly, the laser device 10 may be, for example, a 980 nm pump laser for use in EDFA's. In such an embodiment, the semiconductor gain element 12 may produce a center wavelength of about 974 nm. However, the invention is in no way limited to InGaAs lasers or to such absorption wavelength of EDFA's, as the semiconductor gain element 12 may be constructed from any other suitable substrate material, such as indium gallium arsenide phosphide, aluminium gallium arsenide, etc., and may be used at about 1480 nm, 820 nm, etc. (e.g., for pumping other types of amplifiers such as Raman amplifiers, etc.).

The semiconductor gain element 12 may be any suitable length. In one embodiment, the semiconductor gain element length is greater than 3 mm to ensure a high gain. In another embodiment, the semiconductor gain element is about 3.6 mm. In another embodiment, the semiconductor gain element is greater than 4 mm.

The semiconductor gain element 12 includes an optical waveguide 20 having a rear facet 16 and a front facet 18. The waveguide 20 may also be referred to as a semiconductor waveguide. The rear facet 16 includes a highly reflective coating around the design wavelength. The coating on the rear facet 16 may impart any suitable amount of reflectivity to generate feedback for laser emission. In one embodiment, the reflectivity of the coating on the rear facet 16 may be greater than 95%. At least 1% reflectance is necessary to enable lasing. The coating on the front facet 18 may impart any suitable amount of reflectivity. Although effective reflectivity of the front facet 18 may be reduced by (e.g. by a factor of about 1000) using a curved waveguide, an AR coating of the front facet 18 may be applied with a reflectivity of less than about 1%.

The waveguide 20 is arranged on and contains the semiconductor gain element 12 such that it is disposed between the rear facet 16 and the front facet 18 and guides optical radiation between the rear facet 16 and the front facet 18. Hence, as used herein, a waveguide is a structure for guiding waves, in this case optical waves. The waveguide 20 may be formed on the semiconductor gain element 12 using any method commonly known in the art. For example, the waveguide 20 may be fabricated by the well-known methods of epitaxial growth and semiconductor etching.

The waveguide 20 is curved such that the longitudinal axis of the waveguide 20 and the face of the front facet 18 are non-orthogonal at least at those portions of the waveguide proximate the front facet 18. As discussed above in relation to the conventional art, such an arrangement reduces optical feedback (i.e., back reflections) from the front facet 18 as the radiation reflected from the front facet 18 does not couple into the waveguide 20 itself. The curvature of the waveguide 20 is designed such that bend losses are minimized. Although the waveguide 20 is herein referred to as curved, there may be one or more linear portions of the waveguide 20. For example, the waveguide 20 may include a linear portion 20*a* having a longitudinal axis that is orthogonal to the face of the rear facet 16 (i.e., parallel to the normal of the rear facet 16), a linear portion 20*c* having a longitudinal axis that is non-orthogonal with respect to the face of front facet 18 (i.e., at an angle to the normal of the front facet 18), and a curved portion 20*b* that joins the two linear portions.

Figure 4:
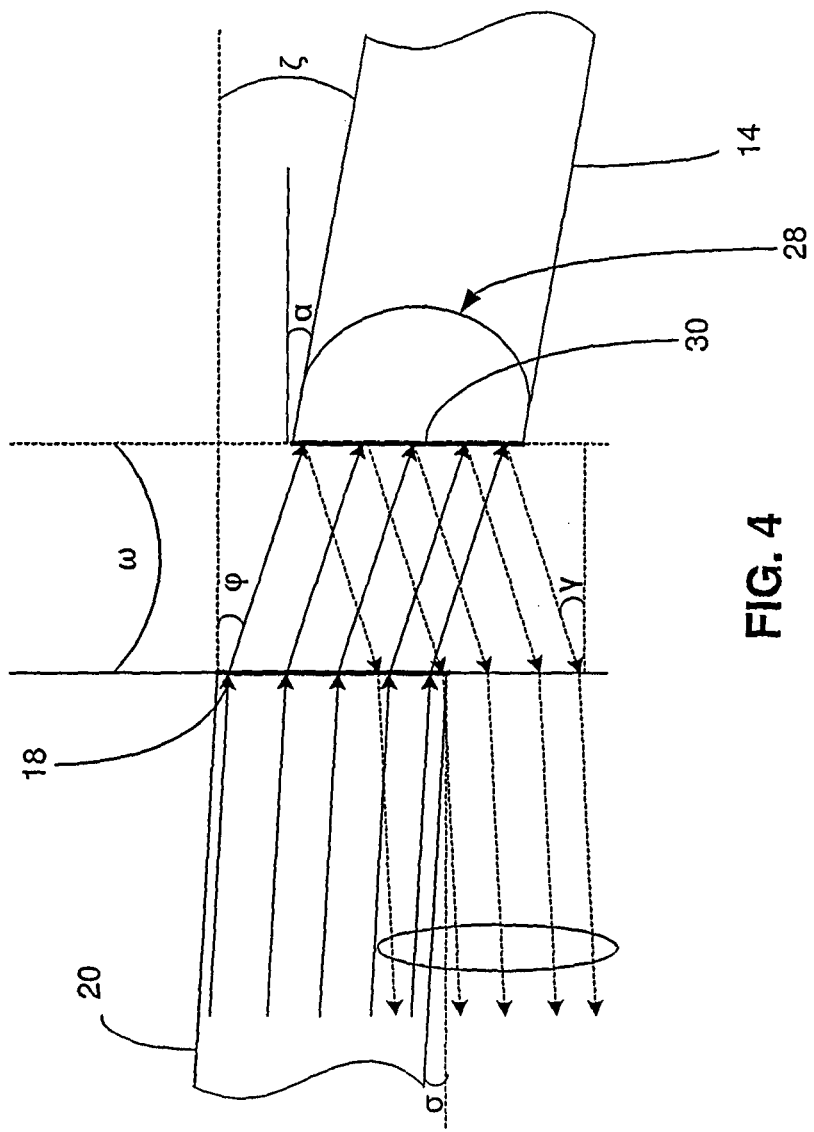
FIG. 4 is a top view schematic diagram illustrating optical coupling of an exemplary laser device in accordance with the present invention.

With additional reference to FIG. 4, the linear portion 20*c* of the waveguide 20 may be arranged at any suitable angle ($\sigma$) from the normal to the face of the front facet 18. In one embodiment the non-orthogonal portion of the waveguide 20 at the front facet 18 may be from about 1.5° to about 15° from the normal to the face of the front facet 18. In another embodiment, the non-orthogonal portion of the waveguide 20 at the front facet 18 may be from about 1.5° to about 5° from the normal to the face of the front facet 18. In another embodiment, the non-orthogonal portion of the waveguide 20 at the front facet 18 may be about 3° from the normal to the face of the front facet 18.

Optical radiation that passes along the waveguide 20 passes through the front facet 18 and is emitted from the semiconductor gain element 12. The optical radiation emitted from the front facet 18 is refracted, with the angle of refraction ($\phi$) being a function of Snell's law. That is, the face of the front facet is non-orthogonal to a propagation direction of optical radiation passed between the waveguide and the optical fiber (i.e., the propagation direction of the laser mode; a propagation direction of the laser mode). For example, in an embodiment wherein the non-orthogonal portion of the waveguide 20 at the front facet 18 is about 3° from the normal to the face of the front facet 18 (which is the angle of incidence at the front facet 18), the angle of refraction ($\phi$) of the optical radiation emitted from the waveguide into air is about 10° from the normal to the face of the front facet 18. Of course, the angle of refraction ($\phi$) is a function of such variables as the angle of incidence and the refractive indices. It is therefore contemplated that the angle of refraction ($\phi$) may range, for example, from about 4.5° to about 60°. In another embodiment, the angle of refraction ($\phi$) may range, for example, from about 4.5° to about 20°.

As mentioned above, the semiconductor gain element 12 is optically coupled to the optical fiber 14. The optical fiber 14 may also be referred to as an optical fiber waveguide. The optical fiber 14 is arranged adjacent the front facet 18 of the semiconductor gain element 12 such that optical radiation may be passed between the semiconductor gain element 12 and the optical fiber 14. That is, optical radiation emitted from the front facet 18 is passed through the fiber lens 28 to the optical fiber 14, which may be any suitable polarization maintaining (PM) fiber or non-PM fiber. A desired amount of feedback from a wavelength selective reflector 26 located along the optical fiber 14 is reflected back from the optical fiber 14 to the semiconductor gain element 12.

The anamorphic fiber lens 28 is arranged on the end portion of the optical fiber 14 adjacent the front facet 18 for optically coupling the semiconductor gain element 12 and the optical fiber 14. The fiber lens 28 includes a lens tip 30 arranged at an angle such that a face of the lens tip 30 is non-orthogonal to the longitudinal axis of the optical fiber 14 at the fiber lens 28. As illustrated, the fiber lens 28 can have the shape of a chisel which specifically accounts for the ellipticity of the laser field.

Figure 5A:
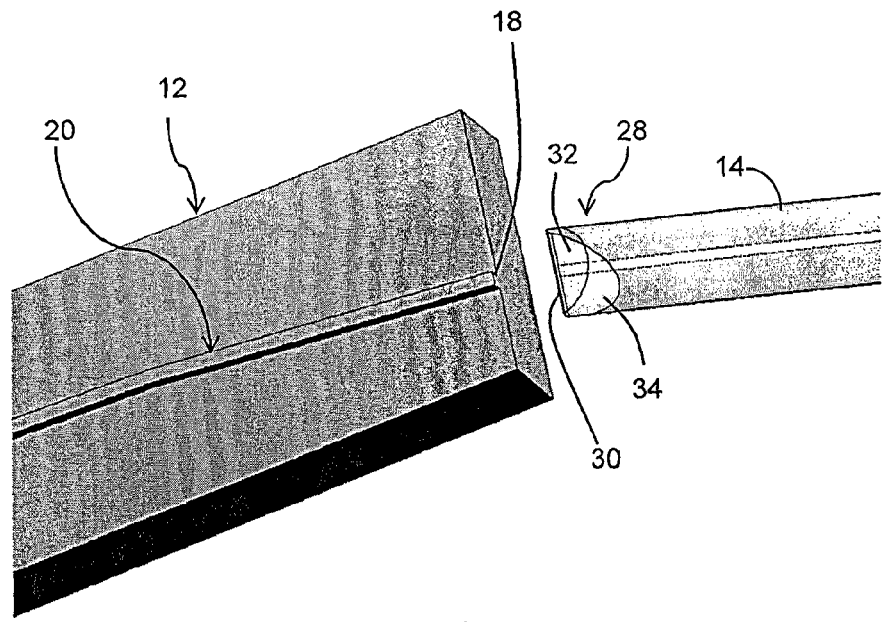
FIGS. 5A and 5B are three-dimensional perspective views of an exemplary laser device in accordance with the present invention.
Figure 5B:
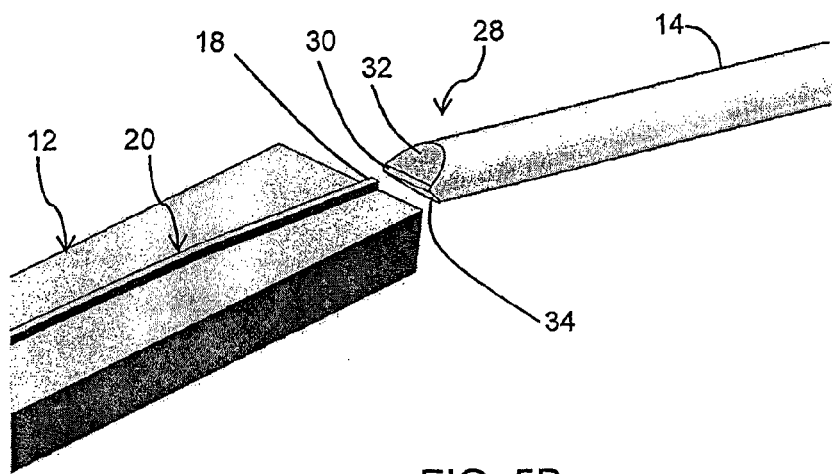

The specific shape of the anamorphic fiber lens 28 can be better seen in FIGS. 5A and 5B which are three-dimensional perspective views of the laser device 10. As illustrated, the fiber lens 28 is formed by tapering the fiber end so as to define end faces 32 and 34.

In one embodiment, the fiber lens 28 has no AR coating, which results in a maximum of about 3.5% Fresnel reflection. The fiber lens 28 may have reduced reflectivity into the waveguide 20 by a factor of about 100 for specific angles. Accordingly, for even lower reflection into the waveguide, in another embodiment the AR coating on the fiber lens 28 may be decreased to a reflectivity of about 1% or less. As illustrated in FIGS. 3-5, while optical fiber 14 is non-orthogonal to the face of the front facet 18 and non-orthogonal to the direction of the optical radiation emitted from the semiconductor gain element 12, the angled lens tip 30 may be arranged such that the face of the lens tip 30 is parallel to the face of front facet 18 and non-orthogonal to the direction of the optical radiation emitted from the semiconductor gain element 12 (i.e., non-orthogonal to a propagation direction of optical radiation passed between the waveguide and the optical fiber). The lens 28 is also laterally displaced (e.g., about 1 μm) with respect to the portion of the waveguide 20 proximate the front facet 18.

With continued reference to FIG. 4, the fiber lens is configured such that the optical radiation emitted from the semiconductor gain element 12 enters the lens tip 30 at a non-orthogonal angle and is further refracted, with the angle of refraction (α) also being a function of Snell's law. For example, in an embodiment where the angle of incidence of the optical radiation relative to the lens tip 30 is about 10° and the refractive index of the fiber core is 1.5, the angle of refraction (α) of the optical radiation relative to the face of the lens tip 30 is about 6.6°, according to Snell's law. As illustrated, the fiber lens 28 and a portion of the optical fiber 14 at the fiber lens 30 may extend longitudinally in the same or substantially the same direction as the direction of the refracted optical radiation. From the range of incident angles of the optical radiation on the fiber tip (given above as the angle of refraction (ϕ) of the optical radiation emitted from the front facet 18) it is therefore contemplated that the angle of refraction (a) may range, for example, from about 2° to about 35°. In another embodiment, the angle of refraction (α) may range, for example, from about 3° to about 13.3°.

While the face of the lens tip 30 may be parallel with the face of the front facet 18, it is also contemplated that the face lens tip 30 may be slightly nonparallel with respect to the face of the front facet 18. The angular relation of the face of the lens tip 30 relative to the face of the front facet 18 can be defined as ω=arcsin [sin(α)×n1/n2]−ϕ, with n1, n2 being the indexes of refraction of the optical fiber and surrounding medium, respectively. In this case it is ensured that light propagates in both forward and backward direction along in the optical axes of the waveguide 20 and the optical fiber 14 (which also functions as a waveguide), respectively, according to Snell's law. Accordingly, at a given angle of refraction (ϕ) of the optical radiation passed through the waveguide relative to the normal of the front facet 18, the angular relation (ω) of the face of the lens tip 30 relative to the face of the front facet 18 may be determined by setting the angle of refraction (α) at the face of the lens tip 30. Of course, the angle of refraction (α) at the face of the lens tip 30 may be found by setting the angular relation (ω) of the face of the lens tip 30 relative to the face of the front facet 18. Furthermore, the angle of the longitudinal axis of the optical fiber 14 at the fiber lens 28 relative to the normal of the face of the front facet 18 is defined as ζ=α−ω. Table 1 exemplifies various arrangements of the optical fiber 14 relative to the front facet 18 of the semiconductor gain element 12 when the angle of refraction (ϕ) is about 10°.

TABLE 1

| α | ω | ζ |
|---|---|---|
| 6.6° | 0° | 6.6° |
| 6° | −0.98° | 6.98° |
| 7° | 0.53° | 6.47° |
| 7.5° | 1.3° | 6.2° |

In practical arrangements the angle (ω) can vary between about −30° and about 30°. In this case angles for (α) range from about 2° to about 35° and the extremes of angle (ϕ) range from about 4.5° to about 60°, respectively.

The arrangement of the lens tip 30 minimizes unwanted back reflection into the waveguide 20. Optical radiation is reflected from the lens tip 30 at an angle γ=ϕ+2ω. Hence, in the exemplary embodiment where the angle of refraction ϕ=10° and ω=0°, the optical radiation is reflected at the lens tip 30 at an angle of (γ) 10°. In another embodiment, the optical radiation is reflected at the lens tip 30 at an angle (γ) greater than 2°. As illustrated in FIG. 4, the radiation reflected from the lens tip 30 does not couple into the waveguide 20.

Figure 2:
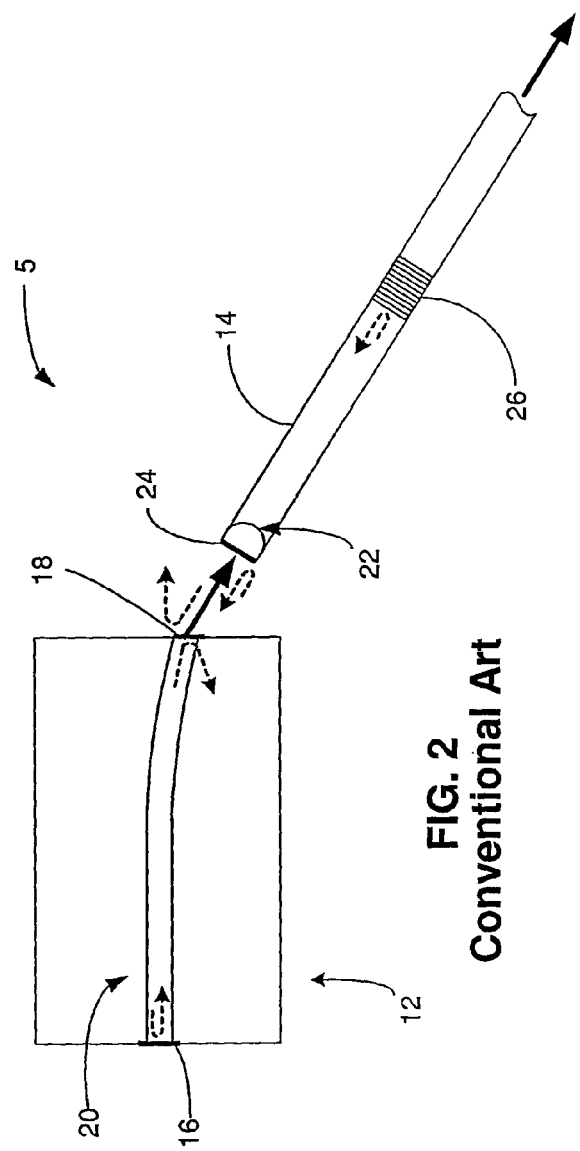
FIG. 2 is a top view schematic diagram of a conventional laser device.

Because the longitudinal axis of the optical fiber 14 at the fiber lens 28 is arranged at an angle (ζ) that is relatively small (e.g. 6.6°) in relation to the normal of the face of the front facet 18, the assembly and alignment procedure may be simplified. Furthermore, the face of the lens tip 30 is parallel or substantially parallel to the face of the front facet 18. The lens tip 30 may be brought close to the front facet 18 of the semiconductor gain element 12 without having to cut away an edge of the fiber lens 28 or accidently positioning the fiber lens 28 such that a portion of the fiber lens 28 touches the semiconductor gain element 12, as may be the case in the conventional design of FIG. 2.

Light coupling is also optimized because the focal plan of the front facet 18 is substantially the same as the focal plane of the fiber lens 28. In one embodiment, the fiber lens 28 provides greater than about 50% coupling efficiency. In another embodiment, the fiber lens 28 provides about 80% coupling efficiency.

A wavelength selective reflector 26 formed by a FBG is arranged in the optical fiber 14. The FBG may be positioned in the optical fiber 14 outside of a typical laser package at a length of at least about 10 cm to simplify manufacturing. But the wavelength selective reflector 26 may be arranged at any suitable length from the semiconductor gain element 12.

The wavelength selective reflector 26 may be formed along the optical fiber 14 using any known process. For example, a wavelength selective reflector 26 may be formed based on exposure to UV radiation having a periodic intensity along a piece of the optical fiber, as described e.g. by Raman Kashyap in "Fiber Bragg Gratings", Academic Press, 1999.

The wavelength selective reflector 26 in the fiber produces a desired percent of feedback and locks the laser device 10 to a wavelength. The reflectance of the wavelength selective reflector 26 may range from about 0.5% to about 20%. In one embodiment, the reflectance of the wavelength selective reflector 26 is about 3%. The bandwidth of the wavelength selective reflector 26 may range from about 10 pm to about 5 nm. In one embodiment, the bandwidth of the wavelength selective reflector 26 is about 20 pm. The center wavelength of the wavelength selective reflector 26 may be any wavelength a semiconductor gain element 12 can support. In one embodiment, the center wavelength of the wavelength selective reflector 26 is about 974 nm. Hence, the wavelength selective reflector 26 substitutes the strongly reduced laser front reflectivity and at the same time enables a wavelength selective laser emission. Accordingly, in the configuration considered in the present invention, the waveguide selective reflector 26 is utilized as a front mirror in combination with the rear facet 16 as a high reflectivity back mirror in order to enable operation of the laser device 10.

A stabilized fiber exit beam leaves the optical fiber 14 and may be fed into a fiber amplifier, e.g. an erbium-doped fiber amplifier (not illustrated). Output power can be typically about 0.6 W, but may range for example, from about 0.1 MW to about 3 W.

Figure 6A:
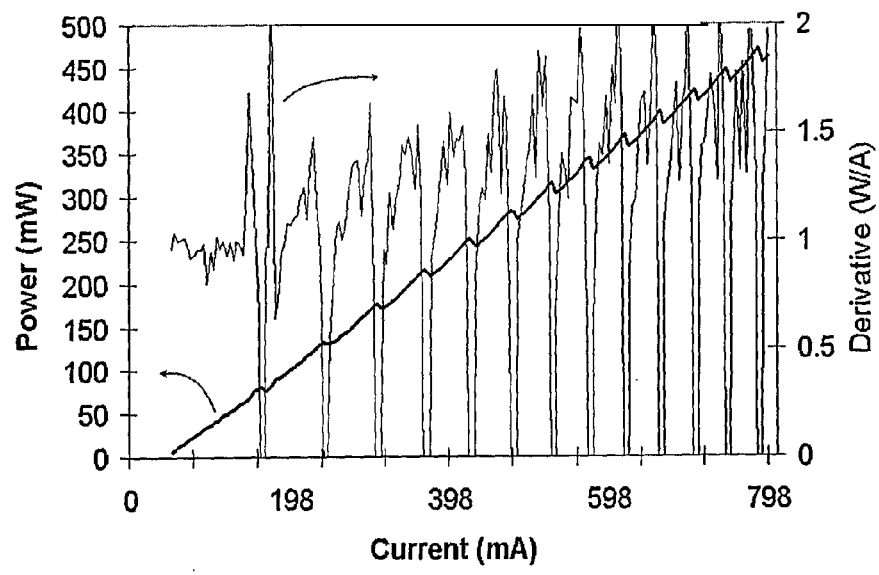
Figure 6B:
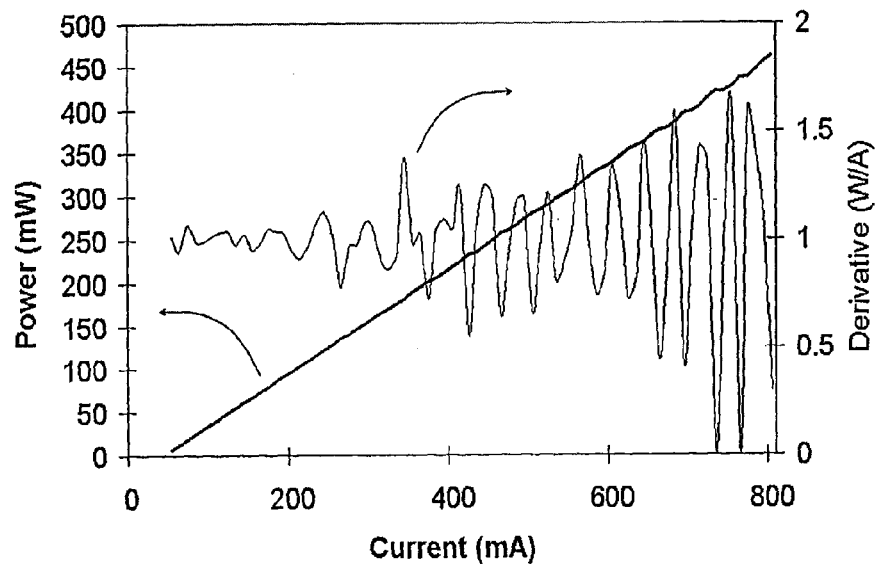

FIG. 6C illustrates the effect of optimum power versus current characteristics and derivative thereof on the exemplary laser device 10 in accordance with the present invention. This is compared with FIGS. 6A and 6B, which illustrate the effect of non optimum power versus current characteristics and derivative thereof on the conventional laser devices 1 and 5 of FIGS. 1 and 2, respectively. As illustrated in FIG. 6C, the device 10 of the present invention produces a highly linear laser emission. By comparison, FIG. 6A illustrates that the conventional device 1 of FIG. 1 produces a high amount of ripple leading to a higher level of noise. FIG. 6A illustrates that while there is some improvement with the conventional device 5 of FIG. 2, the effects in the power versus current characteristics are not fully suppressed.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A laser device including:
a semiconductor waveguide containing a gain element and limited by rear and front facets of the semiconductor waveguide, a face of the front facet of the semiconductor waveguide arranged non-orthogonal to a propagation direction of a laser mode;
an optical fiber waveguide with a fiber lens coupling radiation between the optical fiber and the front facet of the semiconductor waveguide, a substantially planar face of the fiber lens arranged non-orthogonal to the propagation direction and aligned with the face of the front facet;
a wavelength-selective reflector arranged within the optical fiber to form a laser cavity between the rear facet and the wavelength-selective reflector.

2. The laser device of claim 1, wherein the semiconductor waveguide contains a curved section and is configured to direct optical radiation at an angle to the normal of the front facet and parallel to the normal of the rear facet.

3. The laser device of claim 1, wherein the fiber lens is configured as a mode matching element that enables bi-directional transfer of optical radiation.

4. The laser device of any of claim 1, wherein the fiber lens is aligned such that the angle ($\omega$) between the face of the front facet and the face of the fiber lens is determined by relation $$\omega = \arcsin[\sin(\alpha) \times n1/n2] - \phi,$$

where n1 and n2 are indexes of refraction of the optical fiber and surrounding medium, respectively, $\phi$ is an angle of refraction of optical radiation at the face of front facet, and $\alpha$ is an angle of refraction of optical radiation at the face of the fiber lens.

5. The laser device of claim 4, wherein $\phi$ ranges from about 4.5° to about 60°.

6. The laser device of claim 4, wherein a ranges from about 2° to about 35°.

7. The laser device of claim 4, wherein w ranges from about −30° to about 30°.

8. The laser device of claim 4, wherein the fiber lens is configured such that a portion of the optical radiation reflected from the fiber lens is reflected at an angle $\gamma = \phi + 2\omega$, wherein $\gamma$ is greater than about 2°.

9. The laser device of claim 1, wherein the face of the fiber lens is parallel to the face of the front facet.

10. The laser device of claim 9, wherein the angle of refraction of the optical radiation at the front facet of said gain element ranges from about 4.5° to about 20°.

11. The laser device of any of claim 9, wherein the angle of refraction of the optical radiation at the face of the fiber lens ranges from about 3° to about 13.3°.

12. The laser device of any of claim 1, wherein the front facet includes an anti-reflection coating.

13. The laser device of any of claim 1, wherein the fiber lens includes an anti-reflection coating.

14. The laser device of any of claim 1, wherein the wavelength-selective reflector locks the laser device to a wavelength.

15. The laser device of any of claim 1, wherein a bandwidth of the wavelength-selective reflector is from about 10 pm to about 5 nm.

16. The laser device of any of claim 1, wherein the reflectance of the wavelength-selective reflector is from about 0.5% to about 20%.

17. The laser device of claim 1, wherein the semiconductor waveguide comprises a non-orthogonal portion that is arranged at an angle of about 1.5° to about 15° relative to the normal of the face of the front facet.

18. The laser device of claim 1, wherein the optical fiber is coupled to at least one of an erbium-doped fiber amplifier and a Raman amplifier.

19. The laser device of claim 1, wherein the fiber lens is laterally displaced in relation to the face of the front facet.

* * * * *

UNITED STATES PATENT AND TRADEMARK OFFICE
CERTIFICATE OF CORRECTION

PATENT NO.         : 8,526,103 B2                                     Page 1 of 1
APPLICATION NO.    : 12/993617
DATED              : September 3, 2013
INVENTOR(S)        : Stefan Mohrdiek et al.

It is certified that error appears in the above-identified patent and that said Letters Patent is hereby corrected as shown below:

In the Claims:

Column 10, line 15, after "wherein," delete "a" and insert --α--
Column 10, line 17, after "wherein," delete "w" and insert --ω--
Column 10, line 28, after "device" delete "of any"
Column 10, line 31, after "device" delete "of any"
Column 10, line 33, after "device" delete "of any"
Column 10, line 35, after "device" delete "of any"
Column 10, line 38, after "device" delete "of any"
Column 10, line 41, after "device" delete "of any"

Signed and Sealed this
Eighth Day of July, 2014

Michelle K. Lee
*Deputy Director of the United States Patent and Trademark Office*